US005751157A

United States Patent [19]
Kister

[11] Patent Number: 5,751,157
[45] Date of Patent: May 12, 1998

[54] METHOD AND APPARATUS FOR ALIGNING PROBES

[75] Inventor: January Kister, Menlo Park, Calif.

[73] Assignee: Probe Technology, Santa Clara, Calif.

[21] Appl. No.: 681,226

[22] Filed: Jul. 22, 1996

[51] Int. Cl.[6] .................................................. G01R 31/02
[52] U.S. Cl. ........................................ 324/758; 324/762
[58] Field of Search .................................. 324/758, 762, 324/754, 757

[56] References Cited

U.S. PATENT DOCUMENTS

| | | | |
|---|---|---|---|
| 3,781,681 | 12/1973 | Wagner et al. | 324/762 |
| 4,563,640 | 1/1986 | Hasegawa | 324/762 |
| 5,670,889 | 9/1997 | Okubo et al. | 324/762 |

*Primary Examiner*—Ernest F. Karlsen
*Assistant Examiner*—Anh Phung
*Attorney, Agent, or Firm*—Lumen Intellectual Property Services

[57] ABSTRACT

This invention presents a method for aligning a set of probes in a circuit testing apparatus with a set of pads of a circuit under test and the apparatus designed according to this method. The alignment includes the steps of selecting a first group G1 of probes from the set, such that all probes in group G1 have the same tip length L1 and the same beam length L2, and mounting each probe of group G1 on a first mounting block which has a first through-hole for each probe and a first removable portion which includes the first through-hole. During the mounting step the tip portion is placed in the through-hole, the mounting portion is attached to the first mounting block and the first removable portion is discarded. Then, a second mounting block is placed on the first mounting block and a second group G2 of probes selected from the set is mounted it in the same manner as group G1 on the first block. The blocks are aligning on top of each other by using guide holes and positioning holes in conjunction with a corresponding vertical fixing pin and a tiltable positioning pin.

36 Claims, 7 Drawing Sheets

FIG. 11A  FIG. 11B

METHOD AND APPARATUS FOR ALIGNING PROBES

FIELD OF THE INVENTION

The present invention relates to the field of testing electrical circuitry using testing devices with probes, and in particular to a method of aligning probes for achieving an equal force between a probes and pads of a circuit under test.

BACKGROUND OF THE INVENTION

Probe cards or testing devices are crucial to the efficient manufacture of electronic circuits. These devices enable one to test and isolate defective circuits during production. Probe cards are frequently employed for functional testing of integrated circuits on wafers before cutting and mounting them inside an IC chip package. The arbitrary positions and enormous number of contact pads in such circuits, especially in the very large scale integration domain, impose stringent requirements on probe cards.

In particular, the probe card's contacting elements, probe needles or probes are affected by these conditions. The probe is repetitively driven against the pads of wafers under test or C4 solder bumps of electrical circuits. The distance by which the probes are moved towards the pads is commonly called overdrive. When driven against the pad the probe undergoes a deflection and its tip portion executes a lateral movement. The lateral scrubbing of the tip helps to remove an insulating oxide layer formed on the surface of the pad. This ensures proper electrical contact between the probe and the pad. Otherwise, the contact resistance between the probe and the pad would prevent the passage of electrical signals necessary for testing.

Furthermore, the repetitive nature of the testing process, geometrical unevenness of wavers, abrasion and fatigue of probe tips all affect the long-term probe performance. In particular, these factors affect the horizontal alignment or planarity of the probe tips and prevents the establishment of proper electrical contact between the probes and the corresponding pads. Large variance in planarity can not be overcome by increasing the overdrive since this would damage or even destroy the probes. Thus, planarity should be preserved at all times.

It has been recognized that one of the most effective ways to preserve planarity and ensure long life of probes is to ensure that the contact force F between the probes and the pads is equalized. In other words, all probes should preferably experience the same contact force F with the pads. This condition will only be achieved if all probes are properly aligned during the mounting and assembly process.

In fact, attempts have been made at solving these problems by suitable probe mounting and design. In U.S. Pat. No. 5,334,931 Clarke et al. present a probe formed from a molded plastic and equipped with a conductive contact tip. The body of the probe is cantilevered and designed such that the contact tip scrubs the surface of the pad of a device under test when overdrive is applied. Although this construction makes replacement of the conductive contact tip simple, the mounting arrangement is complicated, and planarity can not be ensured after many testing cycles.

In U.S. Pat. No. 5,280,236 Takahashi et al. propose a probe made of a cobalt-based alloy containing at least 10 wt. % of chromium. The probe has a solder-enhanced metallic layer on its other end. These provisions ensure good scrubbing action due to the metallic coating on the tip and probe longevity due to the elasticity of the probe itself. Nonetheless, the application of repetitive stress disturbs probe planarity and deforms the probes. That is partly because Takahashi et al. do not even address the issue of proper alignment of probes during construction of the probe card.

Subramanian describes a high density probe card for testing electrical circuits in U.S. Pat. No. 5,382,898. Although the structure of this device is well-adapted to high frequency ranges and high pad densities it does not address the issue of equalizing the contact force and does not teach how to properly align probes during card assembly.

Ueno et al. in U.S. Pat. No. 5,491,427 teaches how to prolong the life of a probe by adjusting the alignment of the probe electrodes and the device to be probed. In particular, these inventors focus on various geometrical arrangements of the probes. The preferable arrangement of probes, according to their teaching, is in columns. In addition, Ueno et al. accept a certain fail ratio of probes by providing a novel grid pattern of electrical interconnections which allow one to continue probing while avoiding the failed probes. Defective and failed probes are shorted out of the electrical circuitry.

This approach does not address how to properly align the probes in columns or other geometrical arrangements during the assembly process. The leeway granted by the ability to short out failed probes gives Ueno et al. a reprise from having to concentrate on this issue.

None of the above solutions examine the probe alignment process. The various prior art approaches attempt to solve planarity and force equalization problems through better probe geometry, design, material composition or location in the probe card.

OBJECTS AND ADVANTAGES OF THE INVENTION

In view of the above, it is a primary object of the present invention to provide a method for aligning probes of a circuit testing apparatus to ensure a high degree of parallelism between the probes. This, in turn, guarantees a high degree of planarity between the probes. As a consequence of good planarity the force F between probes and pads will be equalized.

It is another object of the invention to provide a circuit testing mechanism with probes aligned according to the method of the invention. The mechanism is straightforward in construction and the alignment process can be performed using simple elements.

Yet another object of the invention is to render the alignment method flexible and applicable to various types of probes.

These and other objects and advantages will become more apparent after consideration of the ensuing description and the accompanying drawings.

SUMMARY OF THE INVENTION

These objects and advantages are attained by the method of the invention by aligning a set of probes of a circuit testing apparatus with a set of pads of a circuit under test. Each probe of the set has a tip portion of tip length L1, a beam portion of beam length L2 and a mounting portion. The alignment method includes the steps of selecting a first group G1 of probes from the set, such that all probes in group G1 have the same tip length L1 and the same beam length L2, and mounting each probe of group G1 on a first mounting block which has a first through-hole for each probe and a first removable portion which includes the first through-hole. In particular, during the mounting step the tip portion is placed in the through-hole, the mounting portion is attached to the first mounting block, preferably by epoxy, and the first removable portion is discarded such that the beam portion L2 extends unsupported past the first mounting block.

Then, a second mounting block is placed on the first mounting block and a second group G2 of probes selected from the set is mounted on the second block. Each member of group G2 has the same tip length L1 and the same beam length L2. The second mounting block also has a second through-hole for each probe and a second removable portion which includes the second through-hole. As before, during the mounting step the tip portion is placed in the second through-hole, the mounting portion is attached to the second mounting block, and the second removable portion is discarded, leaving beam portion L2 extending unsupported past the second mounting block.

An aligning step is performed when the first and second mounting blocks are on top of each other. This step requires that a first guide hole be created in the first mounting block and a second guide hole be created in the second mounting block. The two guide holes are aligned when the mounting blocks are on top of each other by passing a vertical fixing pin through both guide holes. Also, the first and second mounting blocks have a first and second positioning holes respectively. The positioning holes are aligned by passing a positioning pin through them. In the preferred embodiment the guide holes are round and the positioning holes are oval, such that the step of aligning includes tilting the positioning pin to achieve alignment of the second mounting block with the first mounting block.

In many situations, the number of probes in the first group G1 and in the second group G2 will be equal. Of course, the method of the invention can be extended to any desired number of mounting blocks, thus creating many levels of probes or groups of probes. Depending on the geometry of the circuit under test the groups can have equal or unequal numbers of probes.

In another embodiment of the invention a first filler is applied to the first mounting block under the mounting portion of each probe of group G1. Analogously, a second filler is applied to the second mounting block under the mounting portion of each probe of group G2. In this way the beam portion L2 of each probe extends unsupported past the filler rather than the mounting block. Thus, using the filler allows to control beam length L2 after assembly.

Finally, the invention also includes an apparatus for aligning the set of probes. The apparatus has mounting blocks positioned and aligned on top of each other according to the method of the invention. Furthermore, in a preferred embodiment the first mounting block has a first central opening and the second mounting block has a second central opening. The first removable portion forms a first periphery of the first central opening and the second removable portion forms a second periphery of the second central opening. The first opening is larger than the second opening. In fact, in the event that many blocks are present, the central opening of each subsequent block is progressively smaller.

The invention will now be described in detail with reference to the attached drawing figures.

DESCRIPTION OF THE FIGURES

FIG. 11A is a side view of the mounting block of FIG. 8.

FIG. 11B is a side view of the mounting block of FIG. 8 after removal of the first section.

DETAILED DESCRIPTION

Figure 1:
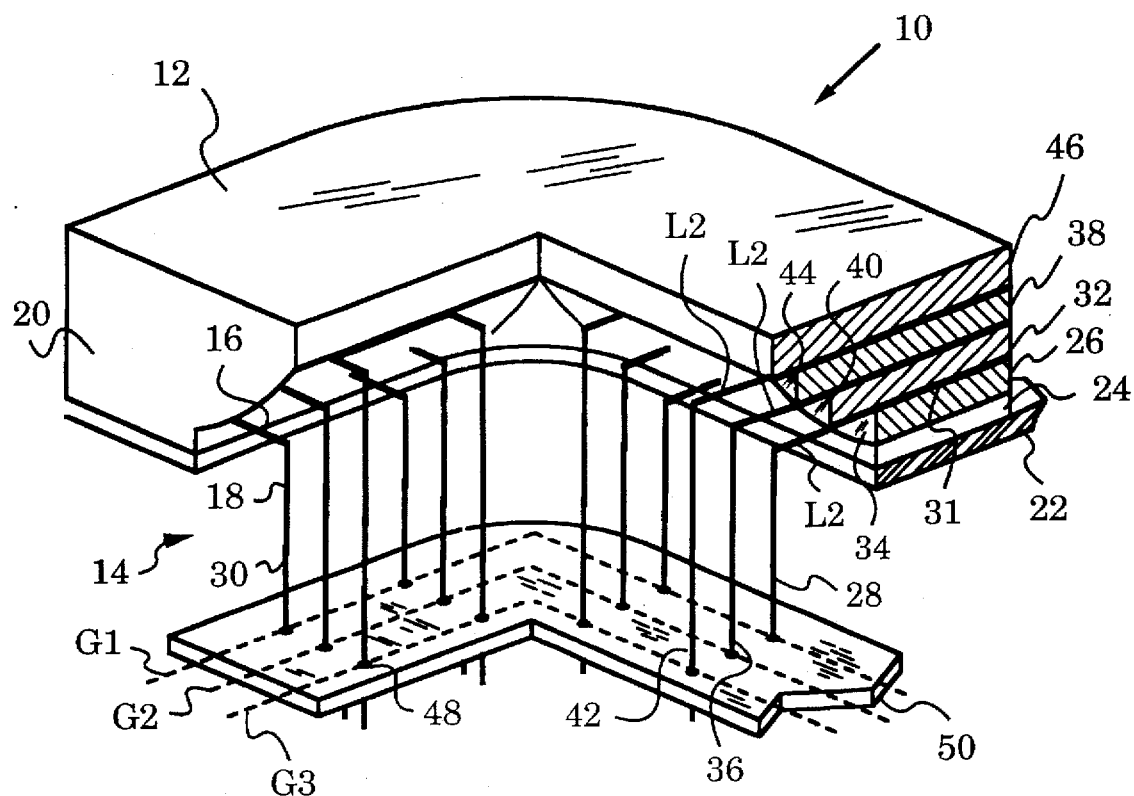
FIG. 1 is a perspective view of a representative portion of a circuit testing apparatus with aligned probes.

The invention will be best understood by first examining a circuit testing apparatus 10 of FIG. 1. The perspective view shows an L-shaped corner portion 12 of apparatus 10. Since most circuits under test have contact pads or C4 bumps arranged in a rectangular array, it is understood that entire apparatus 10 has four corners analogous to portion 12.

Apparatus 10 has a set of probes 14. Each probe, e.g., probe 30, has a beam portion 16 and a tip portion 18. Probes 14 extend or protrude from a block 20 of apparatus 10. As shown on the right side, block 20 actually consists of several layers. The bottom layer is a substrate 22 which can either be an insulating plate or even a printed circuit board. This last option is particularly advantageous when board 22 has the necessary connections and electronics for direct connection of probes 14. An insulating layer or spacer 24 is located on top of substrate 22. In cases where substrate 22 is sufficiently rigid and non-conductive spacer 24 may not be required.

A first mounting block 26 is positioned on top of spacer 24. The cross section of mounting block 26 is essentially rectangular. Block 26 is made of a suitable non-conductive material, e.g., a ceramic. A probe 28 belonging to set 14 is shown mounted on mounting block 26 and protruding out of block 20 under a second mounting block 32. In other words, block 32 is located on top of block 26 and probe 28 is trapped between them by a mounting portion 31.

A first filler 34 is provided on mounting block 26 under mounting portion 30. Filler 34 ensures that only a beam length L2 of probe 28 extends unsupported past filler 34. In addition to this function, filler 34 fills the void created between mounting block 26 and block 32.

A probe 36 of set 14 is mounted on block 32 in an analogous manner as probe 28. A third mounting block 38 bearing another probe 42 is located on top of block 32. A filler 40 is lodged in the void between the bottom edge of block 38 and the side of block 32. Length L2 of the beam portion of probe 36 extends unsupported past filler 40. Finally, a probe 42 protrudes freely from block 20 between block 38, a filler 44 and a top plate 46. Top plate 46 is insulating, rigid, and durable to prevent any damage to the probes of set 14.

The tip portions of probes belonging to set 14, e.g., tip portion 18 of probe 30, pass through holes 48 of an alignment plate 50. The purpose of alignment plate 50 is to reliably guide tip 18 to contact pad 52 of a device or circuit under test 54 as illustrated in FIG. 3.

Figure 2:
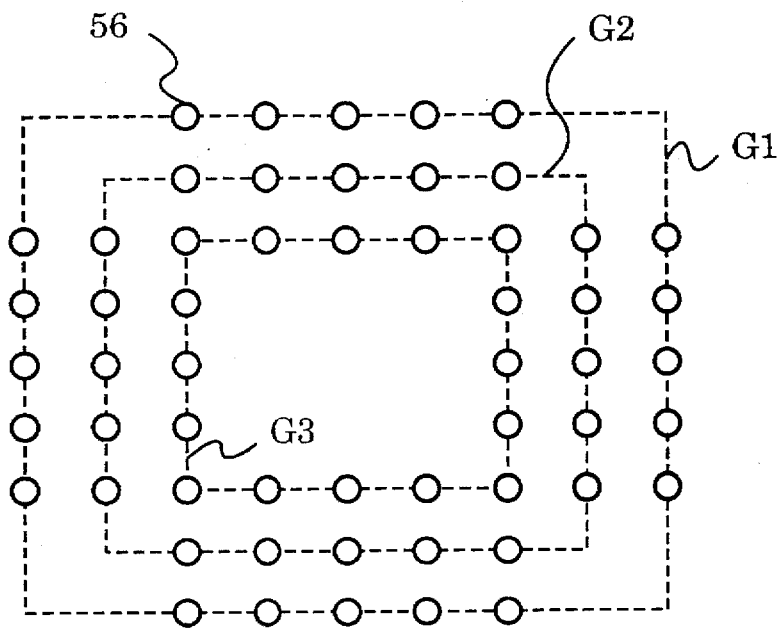
FIG. 2 is a diagram showing the positions of three groups of aligned probes.

As indicated by the dashed lines in FIG. 1, probes of set 14 are actually broken down into three groups: a first group G1, a second group G2 and a third group G3. Probe 18 belongs to group G1, as does probe 28. Probes 36 and 42 belong to groups G2 and G3 respectively. In fact, the selection principle for groups G1, G2 and G3 is that probes belonging to one group have the same beam lengths and tip lengths and are mounted on the same mounting block. Thus, all probes mounted on first mounting block 26 belong to group G1, probes on block 32 belong to group G2, and probes on block 38 are in group G3. To better demonstrate this idea, the diagram of FIG. 2 shows groups G1, G2 and G3 for a device (not shown) similar to apparatus 10 having five probes along each side. The circles referenced by 56 represent the cross sections of the probes.

Figure 3:
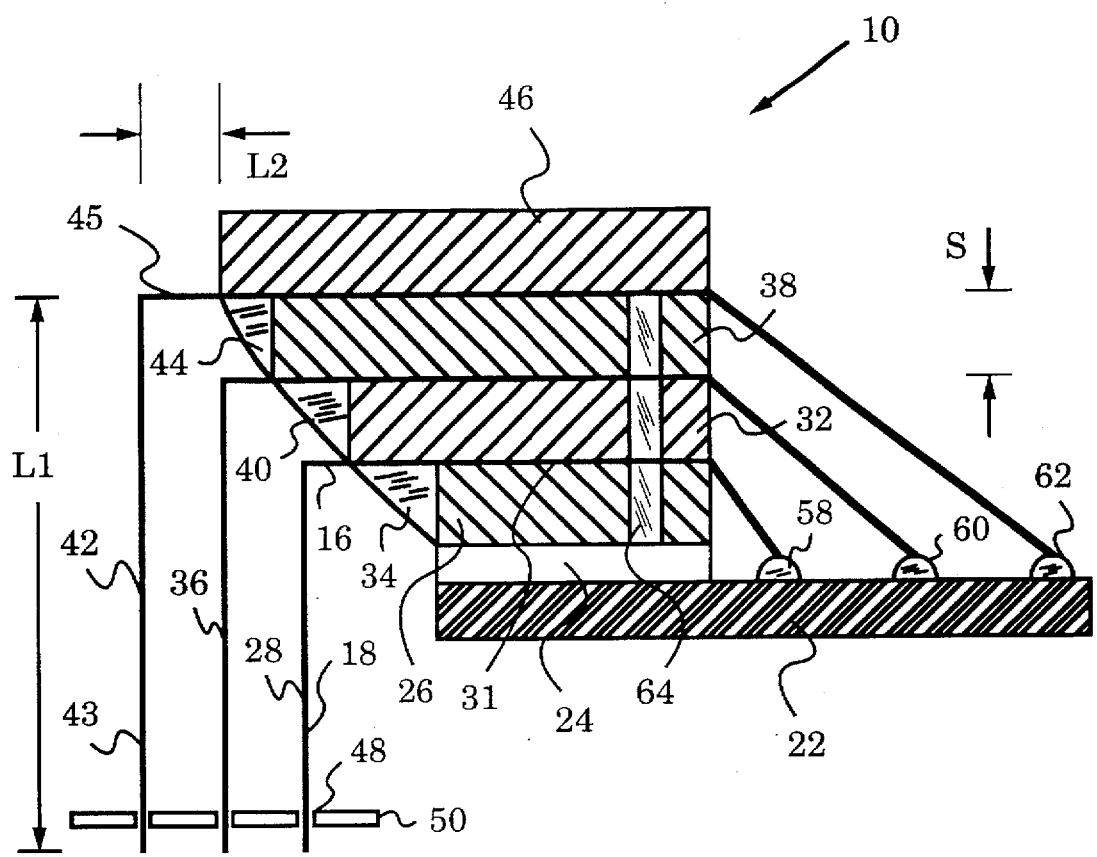
FIG. 3 is a cross sectional view of the circuit testing apparatus of FIG. 1 and a test circuit.
Figure 3:
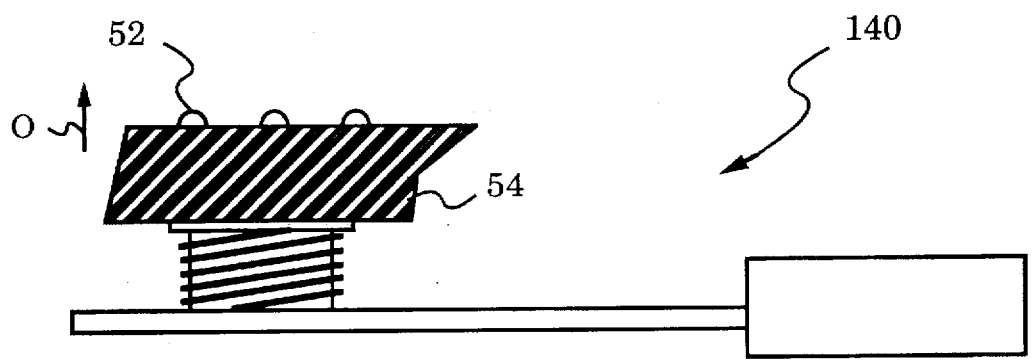

The cross sectional view of FIG. 3 serves to illustrate the details of apparatus 10. Beam length L1 and tip length L2 of probes 28, 36 and 42 belonging to groups G1, G2 and G3 are clearly defined in this view on the example of probe 42. In particular, its tip portion 43 has a tip length L1 and its beam portion 45 has a beam length L2. All probes making up group G3 have the same dimensions as probe 42.

Actually, the construction shown in FIG. 3 represents the preferred embodiment of an apparatus according to the invention. Substrate 22 is a printed circuit board (PC board) with junctions 58, 60, and 62 for attaching the probes of set 14, i.e., in this view the ends of probes 28, 36 and 42. This permits one to establish a direct connection between the testing circuit (not shown) on PC board 22 and probes 28, 36 and 42. Probes 28, 36 and 42 are mounted on their corresponding mounting blocks 26, 32 and 38 by an adhesive material 64 such as epoxy. There are two effects holding probe 28 by its mounting portion 31: the adhesive action of adhesive 64 and the pinching between mounting block 26 and 32. The same is the case for other probes of group G1. The other probes of set 14, i.e., groups G2 and G3, are held by epoxy 64 between successive mounting blocks.

Figure 4:
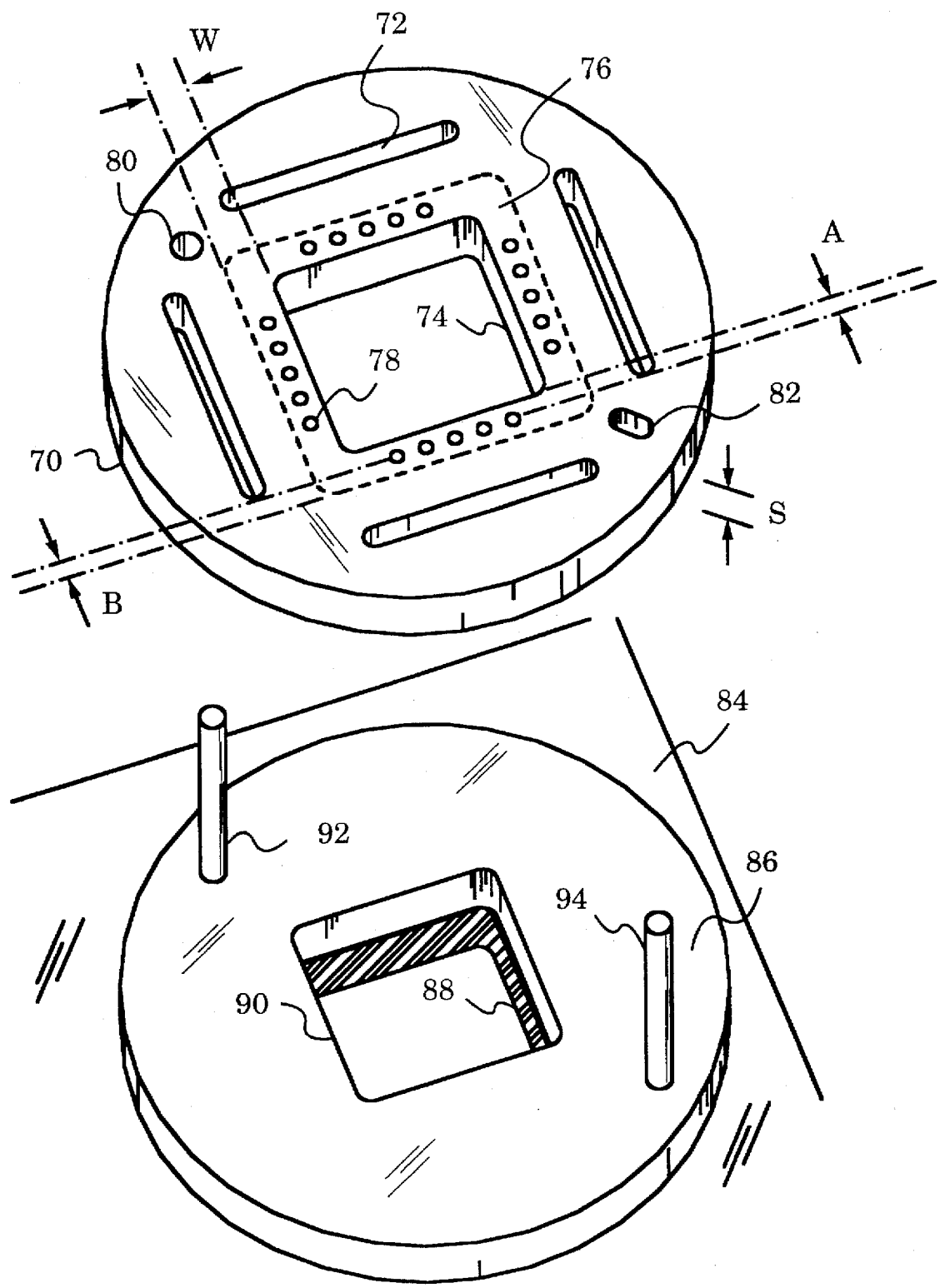
FIG. 4 is a perspective view of a mounting block according to the invention.
Figure 5:
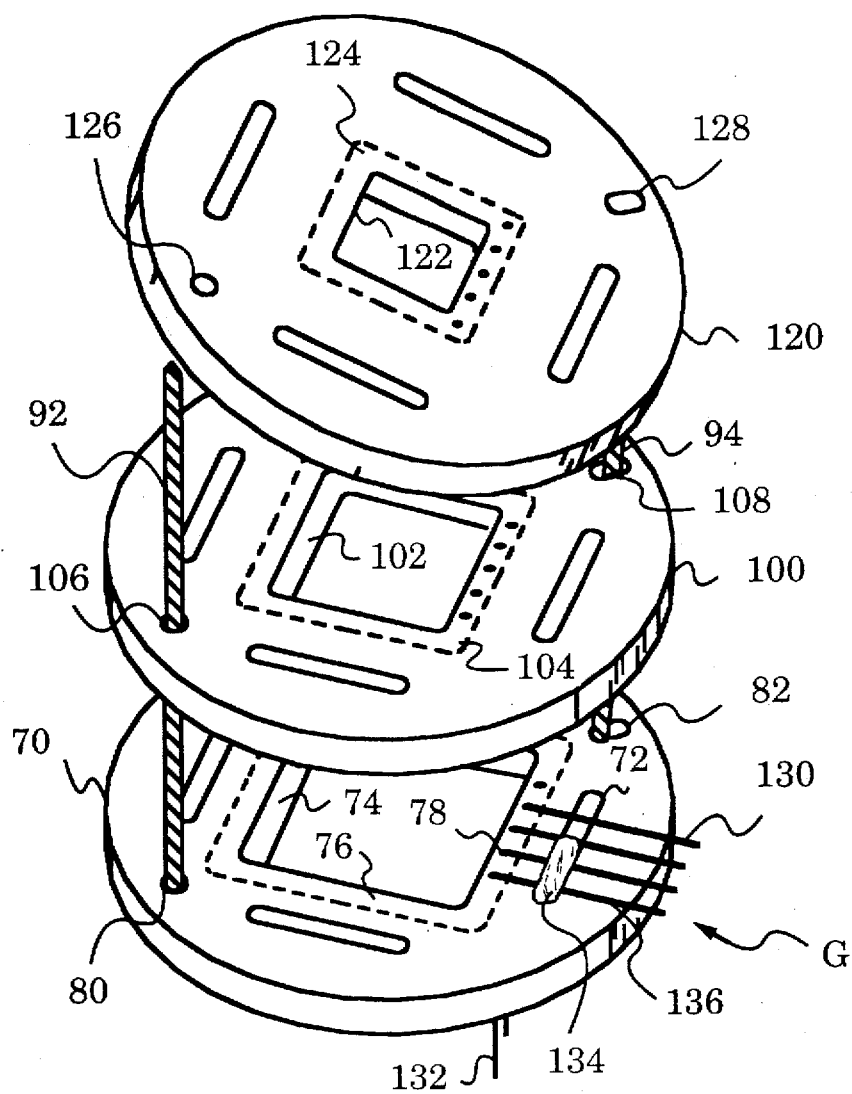
FIG. 5 is a perspective view of three successive mounting blocks being placed and aligned on top of each other.
Figure 6:
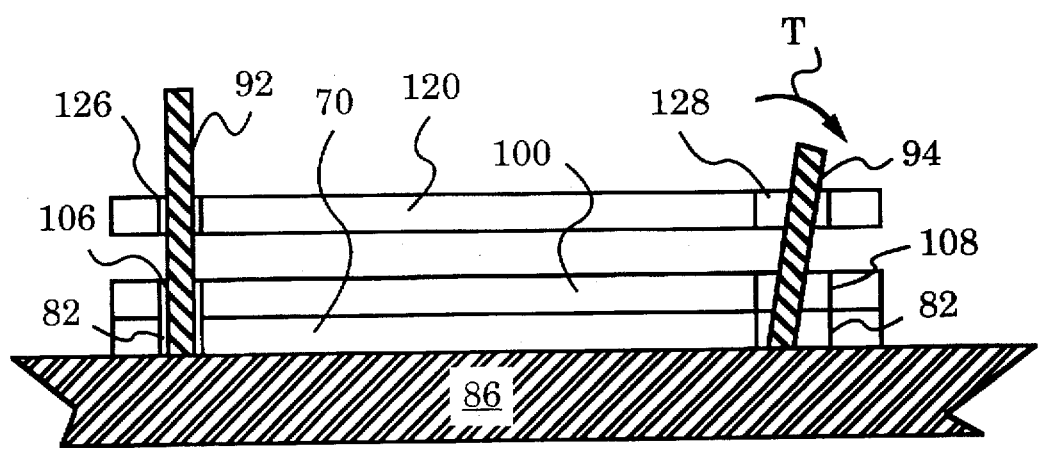
FIG. 6 is a cross sectional view illustrating the alignment process.

The method of making circuit testing apparatus 10 or similar device is a very important part of the present invention. FIGS. 4, 5 and 6 elucidate this method in a general manner. In FIG. 4 an entire first mounting block 70 is shown. The thickness of block 70 is denoted by S. Although block 70 is round, it could also have a different shape, e.g., rectangular or square.

An area forming a first periphery 76 of a first central opening 74 is delimited by a dashed line. This area is removable and thus conveniently referred to as removable portion 76 of block 70. In fact, removable portion 76 can be discarded by breaking it off along the dashed line. As indicated by the dotted and dashed lines, the width of removable portion 76 is equal to W.

A set of through-holes 78 is drilled or otherwise produced in removable portion 76. The diameter of through-holes 78 is sufficiently large to admit the tip portion of a probe belonging to the group of probes which is to be mounted on block 70. Through-holes 78 on each side are lined up with respect to each other. The distance of the centers of through holes 78 from the edge of central opening 74 is equal to A. The distance of the centers of through-holes 78 from the dashed line designating removable portion 76 is B. Although in the embodiment shown distances A and B are nearly equal, this is not a requirement. The positioning of through-holes 78 will generally depend on the parameters of probes of the group to be mounted on block 70, i.e., the desired beam length L2.

Four slots 72 are cut in block 70 around first central opening 74. Although the shape of slots 72 is not crucial, they should preferably extend along all though-holes 78 for reasons which will become apparent below. The depth of slots 72 should be sufficient to accommodate an adhesive agent, e.g., epoxy. In the present embodiment slots 72 pass through entire block 70.

A first guide hole 80 and a first positioning hole 82 are provided on diametrically opposite sides of block 70. In the present embodiment hole 80 is round and hole 82 is oval. The major axis of hole 82 extends radially outward, as depicted in FIG. 4. Both holes 80 and 82 have traverse block 70.

A substrate or PC board 84 is shown below block 70. An insulating layer 86 having the same shape as block 70 is permanently affixed on board 84. The center of board 84 has a central opening 88 of the same size as opening 74. Analogously, insulating layer 86 has a central opening 90 of the same size as opening 86 and is aligned with the latter.

A vertical fixing pin 92 and a positioning pin 94 are attached at diametrically opposite sides of insulating layer 86. In fact, pins 92 and 94 coincide with the locations of guide hole 80 and positioning hole 82 respectively. Positioning pin 92 is stationary and exactly vertical. Positioning pin 94 can be pivoted or tilted about its base.

The actual method of assembly is illustrated in FIG. 5 on the example of three blocks: first mounting block 70, a second mounting block 100, and a third mounting block 120. Blocks 100 and 120 are similar to block 70 located at the bottom, except that central openings 102 and 122 of these blocks are progressively smaller. In other words central opening 74 of block 70 is larger than central opening 102 of block 100, which is in turn larger than central opening 122 of block 120. Removable portions 76, 104 and 124 of these blocks are dimensioned to obtain the desired free or unsupported beam length L2 of probes in the respective groups, i.e., G1, G2 and G3, which are to be mounted on blocks 70, 100 and 120.

The mounting of probes 130 belonging to first group G1 is shown on block 70. Tip portions 132 of four probes 130 have already been inserted into corresponding through-holes 78. A suitable quantity of a bonding or adhesive agent 134, preferably epoxy, has been deposited in slot 72 to hold mounting portions 136 of probes 130 in place.

Once twenty probes 130 are fixed on block 70 in this fashion, block 100 will be placed on top of block 70. Blocks 70 and 100 will be aligned by means of fixing pin 92 and positioning pin 94. In particular, block 70 is guided by pins 92 and 94 to rest against layer 86 (see FIG. 4). Then guide hole 106 and positioning hole 108 of block 100 are used to place and align it on top of block 70. Analogously, guide and positioning holes 126 and 128 are provided for the same purpose in block 120.

A simplified view illustrating this process is afforded by FIG. 6. In this drawing block 100 has already been placed on top of block 70. Block 120 is just being positioned. Positioning pin 92 ensures a good centering of all blocks. Meanwhile, proper alignment of the blocks is attained by tilting positioning pin 94 as shown by arrow T. Obviously, this step has to be performed before the adhesive agent used to affix the probes sets. Removable portions 76, 104 and 124 are discarded one by one once the corresponding block is aligned with the previous block.

A person with average skill in the art will understand that the above method can be applied to build apparatus 10, or any similar apparatus. The great advantage of this method is the possibility of performing very accurate alignment corrections. This ensures a high degree of parallelism between the individual probes and guarantees a high degree of planarity between the probes. As a consequence the force between probes and pads will be equalized. This is observed, for example, when circuit under test 54 is driven by assembly 140 in the direction of arrow 0 against set of probes 14 (see FIG. 3).

Another advantage of the apparatus and method of the invention is that they are simple. This is especially true of the alignment step which accomplished accurate alignment of blocks with pins 92 and 94.

Figure 7:
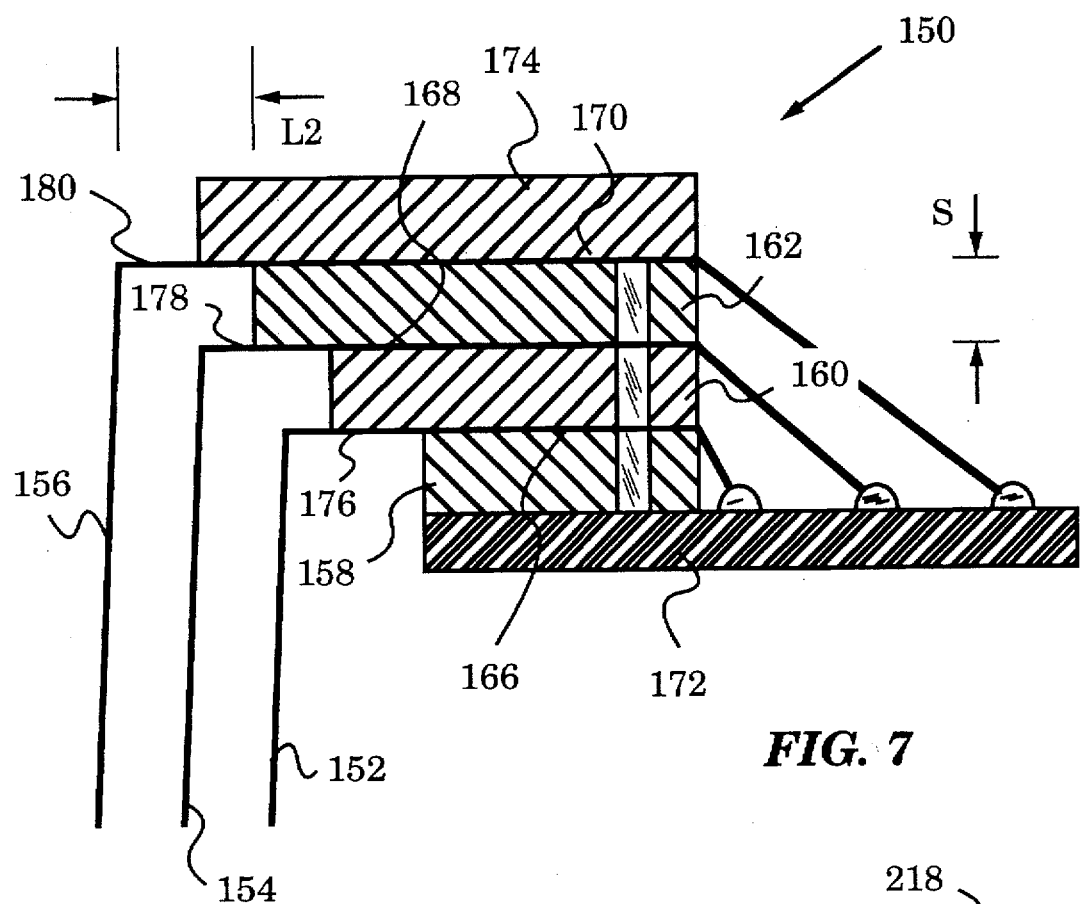
FIG. 7 is a cross sectional view of another embodiment of an apparatus according to the invention.

FIG. 7 shows another apparatus 150 according to the invention. The cross sectional view shows three probes 152, 154 and 156 mounted between mounting blocks 158, 160 and 162 as shown. Adhesive agent 164 is used to fix mounting portions 166, 168 and 170 of probes 152, 154 and 156. Without any intervening insulating layer, block 158 is set directly on a PC board 172. A top layer 174 protects the blocks form the top side.

Apparatus 150 is constructed in the same manner as described above. No filler is used between the blocks and probes 152, 154 and 156. Thus, beam length L2 of beam portions 176, 178 and 180 is longer than in the previous embodiment. In other words, the unsupported parts (beam portions 176, 178 and 180) of probes 152, 154 and 156 are longer.

Figure 8:
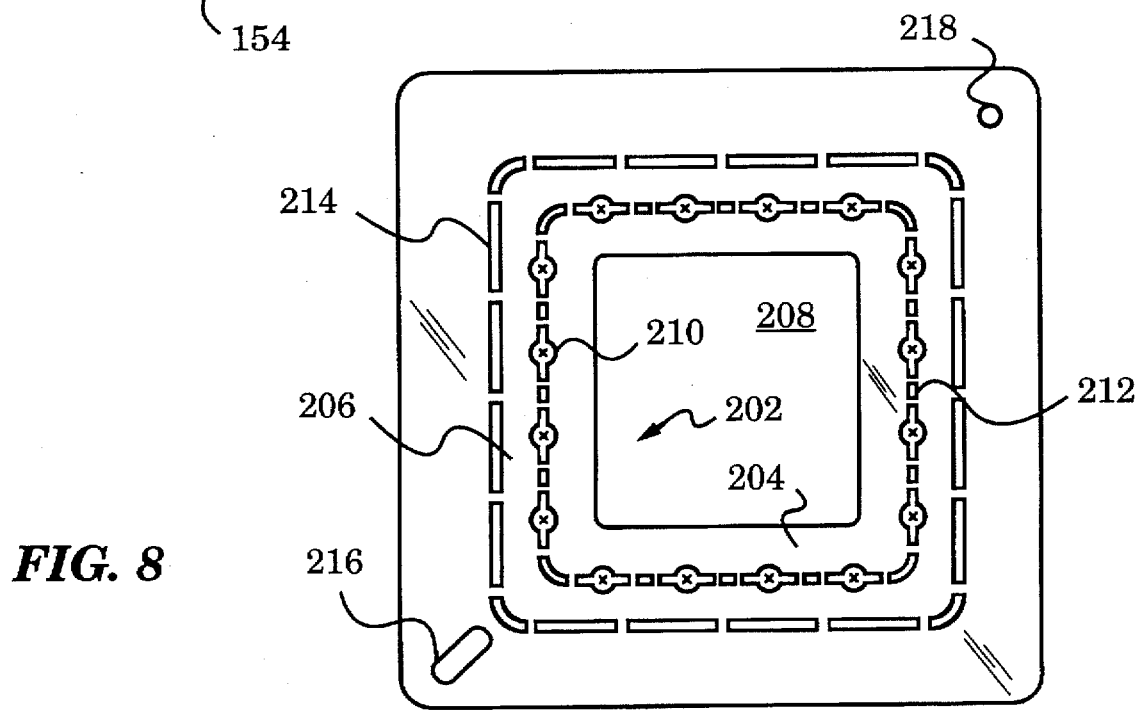
FIG. 8 is a top plan view of another mounting block according to the invention.

In another embodiment of the invention as shown in FIG. 8 a mounting block 200 has a removable portion 202 made up of a first removable section 204 and a second removable section 206. First removable section 204 extends from the periphery of a central opening 208 to first through-holes 210. In fact, a set of pre-cut slots or perforations 212 passing through the centers of through-holes 210 separate first removable section 204 from second removable section 206. Perforations 212 are cut such that section 204 can be removed without affecting section 206 in the process.

Thus, second removable section 206 commences at first through holes 210 and extends up to another set of perforations 214. Perforations 214 enable one to remove break off section 206 from mounting block 200. As before mounting block 200 also has a positioning hole 216 and a guide hole 218.

Figure 9:
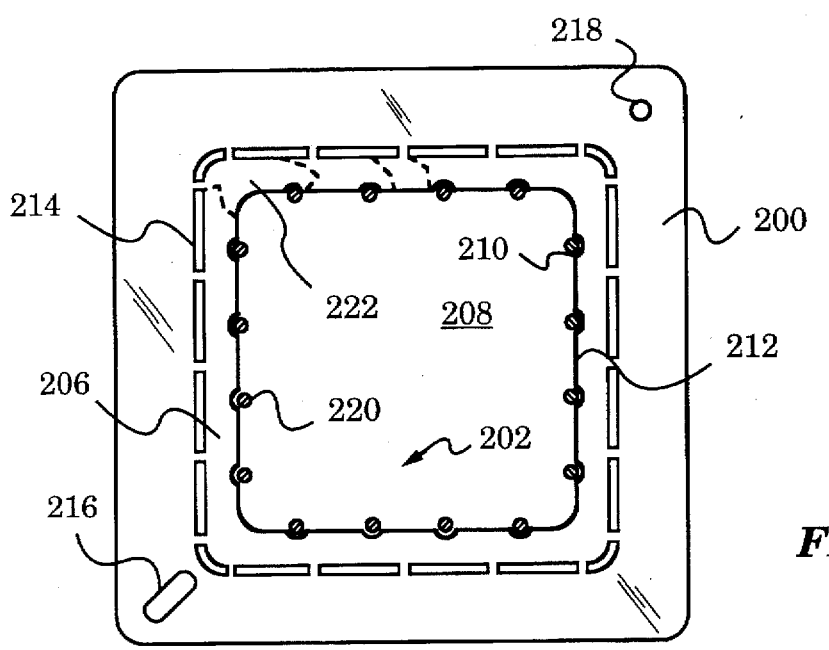
FIG. 9 is a top plan view of the mounting block of FIG. 8 after removal of a first section of the removable portion.
Figure 10:
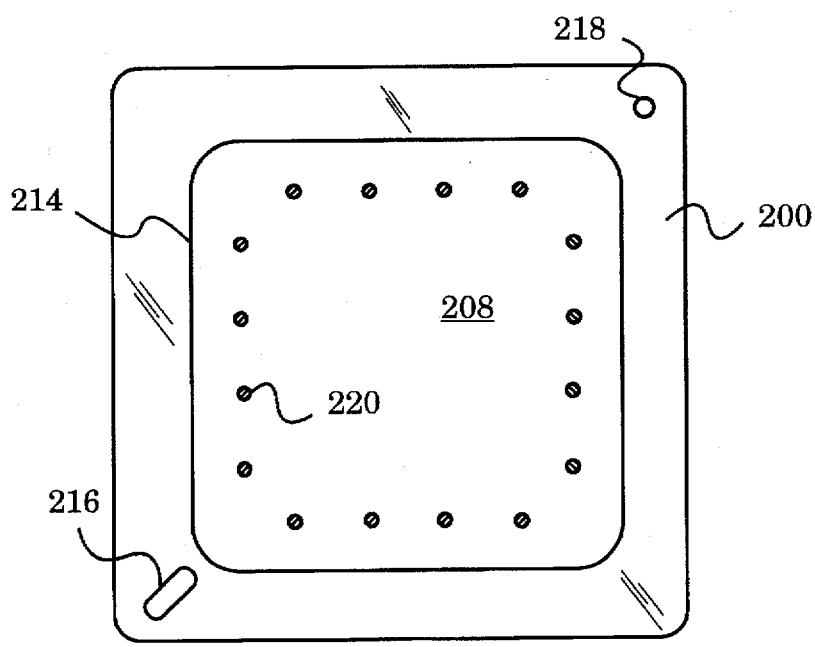
FIG. 10 is a top plan of the mounting block of FIG. 8 after removal of a second section of the removable portion.

The advantages of mounting block 200 are clarified in FIGS. 9 and 10 where probes 220 are placed in first through-holes 210 and first removable section 204 is broken off. In a subsequent step second section 206 is removed, as shown in FIG. 10. In fact, section 206 is preferably removed in portions or parts 222 indicated in dashed lines in FIG. 9. Appropriate size of perforations 214 and thickness of mounting block 200 will ensure that section 206 crumbles into portions 222.

Figure 11C:
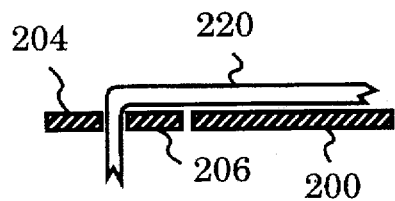
FIG. 11C is a side view of the mounting block of FIG. 8 after removal of the second section.
Figure 11C:
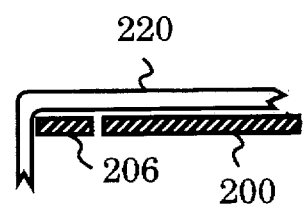
Figure 11C:
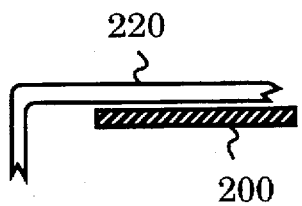

Thus, in this embodiment removable portion 202 is discarded in two steps. FIGS. 11A–C illustrate each of the steps described above in a side view for clarity. The method is very advantageous because it minimizes any disturbance to probes 220. Consequently, probes 220 are not bent during the mounting process and preserve good planarity. Also, this way of removing portion 202 is very well-suited for manufacturing.

Figure 12:
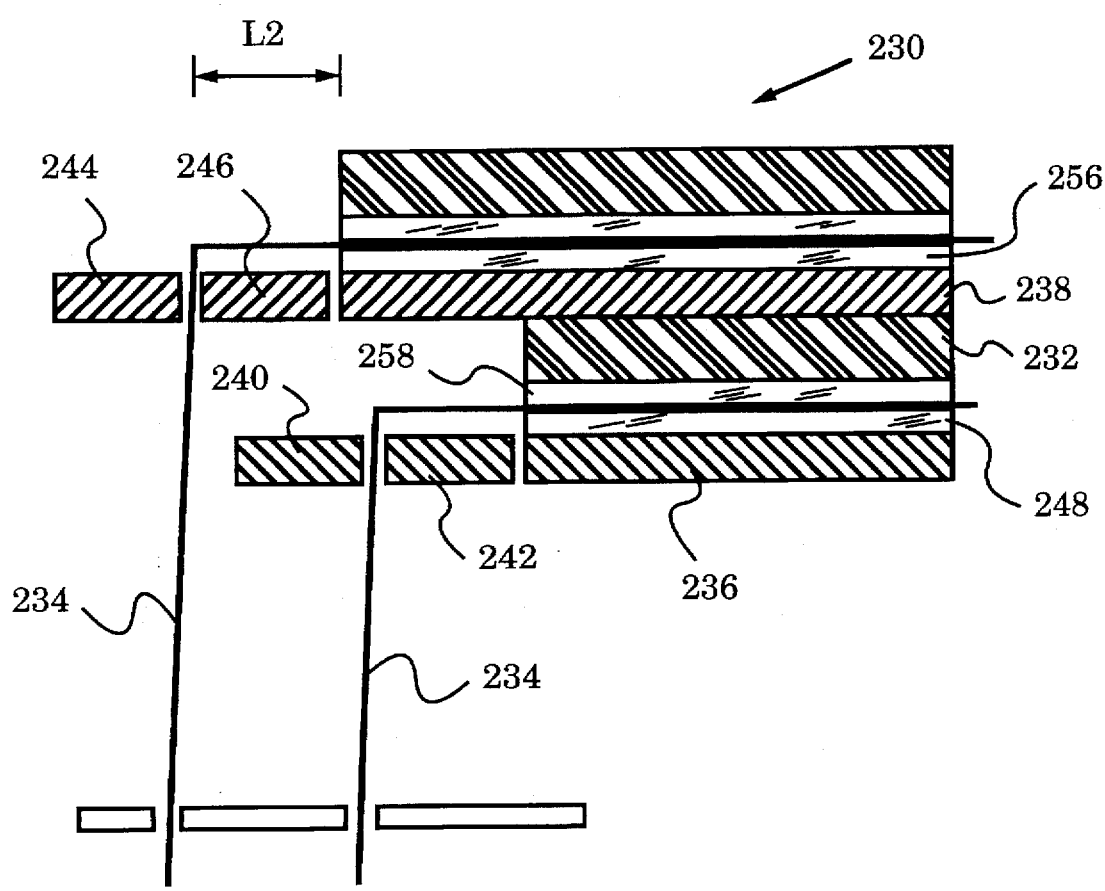
FIG. 12 is a side view of yet another embodiment of the invention.

In yet another embodiment, as shown in FIG. 12, a block 230 with probes 234 has a spacer layer or spacer block 232 positioned between a first mounting block 236 and a second mounting block 238. As in the above embodiment, mounting block 236 has a first removable section 240 and a second removable section 242. Analogously, block 238 has removable sections 244 and 246.

Epoxy layers 248 and 250 bind probes 234 to respective blocks 236 and 238. Another layer of epoxy 252 is placed on top of probes 234 mounted on block 236 to affix spacer 232. Fixing between spacer 232 and block 238 can be ensured by epoxy or other means known in the art.

This embodiment helps to better control the mounting process and hold down probes 236 before mounting subsequent blocks. Spacer 232 is also needed to because probes 236 are not always horizontal along their beam length portion L2. In addition, if desired, spacer 232 can determine beam length L2 (not shown) if mounting block 238 were broken off up to the edge of the spacer.

It will be clear to one skilled in the art that the above embodiments may be altered in many ways without departing from the scope of the invention. In particular, the shape of the mounting blocks and the arrangement of probes will be altered depending on the circuit or device being tested. Some devices will require less complicated testing devices, e.g., linear ones, and some may require a still more complicated apparatus having a large number of levels and corresponding probe groups. Accordingly, the scope of the invention should be determined by the following claims and their legal equivalents.

What is claimed is:

1. A method of aligning a set of probes of a circuit testing apparatus with a set of pads of a circuit under test, each probe of said set of probes having a tip portion of tip length L1, a beam portion of beam length L2 and a mounting portion, said method comprising the following steps:

a) selecting a first group G1 of probes from said set of probes, such that each probe of said first group G1 has the same tip length L1 and each probe of said first group G1 has the same beam length L2;

b) mounting each probe of said first group G1 on a first mounting block, said first mounting block having a first through-hole for each probe of said first group G1 and a first removable portion comprising said first through-hole, said mounting step comprising:
      1) placing said tip portion in said first through-hole;
      2) attaching said mounting portion to said first mounting block;
      3) discarding said first removable portion, such that said beam portion L2 extends unsupported past said first mounting block;

c) placing a second mounting block on said first mounting block;

d) selecting a second group G2 of probes from said set of probes, such that each probe of said second group G2 has the same tip length L1 and each probe of said second group G2 has the same beam length L2;

e) mounting each probe of said second group G2 on said second mounting block, said second mounting block having a second through-hole for each probe of said second group G2 and a second removable portion comprising said second through-hole, said mounting step comprising:
      1) placing said tip portion in said second through-hole;
      2) attaching said mounting portion to said second mounting block;
      3) discarding said second removable portion, such that said beam portion L2 extends unsupported past said second mounting block; and f) aligning said first mounting block with said second mounting block.

2. The method of claim 1, wherein said step of aligning said first mounting block with said second mounting block comprises:

a) creating a first guide hole in said first mounting block;
   b) creating a second guide hole in said second mounting block, such that said first guide hole and said second guide hole are aligned when said second mounting block is placed on said first mounting block;
   c) passing a vertical fixing pin through said first guide hole and said second guide hole;
   d) creating a first positioning hole in said first mounting block;
   e) creating a second positioning hole in said second mounting block; and
   f) passing a positioning pin through said first positioning hole and said second positioning hole.

3. The method of claim 2, wherein said first guide hole and said second guide hole are round and said first positioning hole and said second positioning hole are oval and said step of aligning further comprises tilting said positioning pin to achieve alignment of said second mounting block with said first mounting block.

4. The method of claim 1, wherein in said selecting steps the number of probes in said first group G1 and the number of probes in said second group G2 are chosen to be equal.

5. The method of claim 1, wherein said mounting portion is attached to said first mounting block by epoxy and said mounting portion is attached to said second mounting block by epoxy.

6. The method of claim 1, wherein said first removable portion comprises a first removable section terminating at said first through-hole and a second removable section commencing at said first through-hole, such that said first removable section can be removed up to said first through-hole without removing said second section.

7. The method of claim 1, further comprising the step of interposing a spacer block between said first mounting block and said second mounting block.

8. The method of claim 7, further comprising the steps of depositing epoxy on said first mounting block, placing said spacer block on the epoxy, and placing said second mounting block on said spacer block.

9. A method of aligning a set of probes of a circuit testing apparatus with a set of pads of a circuit under test, each probe of said set of probes having a tip portion of tip length L1, a beam portion of beam length L2 and a mounting portion, said method comprising the following steps:

a) selecting a first group G1 of probes from said set of probes, such that each probe of said first group G1 has the same tip length L1 and each probe of said first group G1 has the same beam length L2;

b) mounting each probe of said first group G1 on a first mounting block, said first mounting block having a first through-hole for each probe of said first group G1 and a first removable portion comprising said first through-hole, said mounting step comprising:
      1) placing said tip portion in said first through-hole;
      2) attaching said mounting portion to said first mounting block;
      3) discarding said first removable portion;
      4) applying a first filler to said first mounting block under said mounting portion such that said beam portion L2 extends unsupported past said first filler;

c) placing a second mounting block on said first mounting block;

d) selecting a second group G2 of probes from said set of probes, such that each probe of said second group G2 has the same tip length L1 and each probe of said second group G2 has the same beam length L2;

e) mounting each probe of said second group G2 on said second mounting block, said second mounting block having a second through-hole for each probe of said second group G2 and a first removable portion comprising said second through-hole, said mounting step comprising:
      1) placing said tip portion in said second through-hole;
      2) attaching said mounting portion to said second mounting block;
      3) discarding said second removable portion;
      4) applying a second filler to said second mounting block under said mounting portion such that said beam portion L2 extends unsupported past said second filler;

f) aligning said first mounting block with said second mounting block.

10. The method of claim 9, wherein said step of aligning said first mounting block with said second mounting block comprises:

a) creating a first guide hole in said first mounting block;
   b) creating a second guide hole in said second mounting block, such that said first guide hole and said second guide hole are aligned when said second mounting block is placed on said first mounting block;
   c) passing a vertical fixing pin through said first guide hole and said second guide hole;
   d) creating a first positioning hole in said first mounting block;
   e) creating a second positioning hole in said second mounting block; and
   f) passing a positioning pin through said first positioning hole and said second positioning hole.

11. The method of claim 10, wherein said first guide hole and said second guide hole are round and said first positioning hole and said second positioning hole are oval and said step of aligning further comprises tilting said positioning pin to achieve alignment of said second mounting block with said first mounting block.

12. The method of claim 9, wherein in said selecting steps the number of probes in said first group G1 and the number of probes in said second group G2 are chosen to be equal.

13. The method of claim 9, wherein said mounting portion is attached to said first mounting block by epoxy and said mounting portion is attached to said second mounting block by epoxy.

14. The method of claim 9, wherein said first removable portion comprises a first removable section terminating at said first through-hole and a second removable section commencing at said first through-hole, such that said first removable section can be removed up to said first through-hole without removing said second section.

15. The method of claim 14, further comprising the step of interposing a spacer block between said first mounting block and said second mounting block.

16. The method of claim 15, further comprising the steps of depositing epoxy on said first mounting block, placing said spacer block on the epoxy, and placing said second mounting block on said spacer block.

17. An apparatus for aligning a set of probes of a circuit testing apparatus with a set of pads of a circuit under test, each probe of said set of probes having a tip portion of tip length L1, a beam portion of beam length L2 and a mounting portion, said apparatus comprising:

a) a first group G1 of probes selected from said set of probes, such that each probe of said first group G1 has the same tip length L1 and each probe of said first group G1 has the same beam length L2;

b) a first mounting block having a first through-hole for each probe of said first group G1, such that each probe of said first group G1 has said tip portion in said first through-hole and said mounting portion attached to said first mounting block, said first mounting block further having a first removable portion comprising said first through-hole, such that when said first removable portion is discarded said beam portion L2 extends unsupported past said first mounting block;

c) a second group G2 of probes selected from said set of probes, such that each probe of said second group G2 has the same tip length L1 and each probe of said second group G2 has the same beam length L2;

d) a second mounting block placed on said first mounting block, said second mounting block having a second through-hole for each probe of said second group G2, such that each probe of said second group G2 has said tip portion in said second though-hole and said mounting portion attached to said second mounting block, said second mounting block further having a second removable portion comprising said second through-hole, such that when said second removable portion is discarded said beam portion L2 extends unsupported past said second mounting block; and e) an aligning means for aligning said second mounting block with said first mounting block.

18. The apparatus of claim 17, wherein said first block has a first guide hole and a first positioning hole, and said second mounting block has a second guide and a second positioning hole, and said aligning means comprises:

a) a vertical fixing pin for passing through said first guide hole and said second guide hole; and d) a positioning pin for passing through said first positioning hole and said second positioning hole.

19. The apparatus of claim 18, wherein said first guide hole and said second guide hole are round and said first positioning hole and said second positioning hole are oval.

20. The apparatus of claim 17, wherein the number of probes in said first group G1 and the number of probes in said second group G2 are equal.

21. The apparatus of claim 17, wherein said mounting portion is attached to said first mounting block by epoxy and said mounting portion is attached to said second mounting block by epoxy.

22. The apparatus of claim 17, wherein said first mounting block has a first central opening and said second mounting block has a second central opening and said first removable portion forms a first periphery of said first central opening and said second removable portion forms a second periphery of said second central opening.

23. The apparatus of claim 22, wherein first central opening is larger than said second central opening.

24. The apparatus of claim 17, wherein said first removable portion comprises a first removable section terminating at said first through-hole and a second removable section commencing at said first through-hole.

25. The apparatus of claim 17, further comprising a spacer block between said first mounting block and said second mounting block.

26. The apparatus of claim 25, further comprising epoxy on said first mounting block under said spacer block.

27. An apparatus for aligning a set of probes of a circuit testing apparatus with a set of pads of a circuit under test, each probe of said set of probes having a tip portion of tip length L1, a beam portion of beam length L2 and a mounting portion, said apparatus comprising:

a) a first group G1 of probes selected from said set of probes, such that each probe of said first group G1 has the same tip length L1 and each probe of said first group G1 has the same beam length L2;

b) a first mounting block having a first through-hole for each probe of said first group G1, such that each probe of said first group G1 has said tip portion in said first through-hole and said mounting portion attached to said first mounting block, said first mounting block further having a first removable portion comprising said first through-hole, such that when said first removable portion is discarded said beam portion L2 and a part of said mounting portion extend unsupported past said first mounting block;

c) a first filler applied to said first mounting block under said part of said mounting portion, such that only said beam portion L2 extends unsupported past said first filler;

d) a second group G2 of probes selected from said set of probes, such that each probe of said second group G2 has the same tip length L1 and each probe of said second group G2 has the same beam length L2;

e) a second mounting block placed on said first mounting block, said second mounting block having a second through-hole for each probe of said second group G2, such that each probe of said second group G2 has said tip portion in said second though-hole and said mounting portion attached to said second mounting block, said second mounting block further having a second removable portion comprising said second through-hole, such that when said second removable portion is discarded said beam portion L2 and a part of said mounting portion extend unsupported past said second mounting block;

f) a second filler applied to said second mounting block under said part of said mounting portion, such that only said beam portion L2 extends unsupported past said second filler; and g) an aligning means for aligning said second mounting block with said first mounting block.

28. The apparatus of claim 27, wherein said first block has a first guide hole and a first positioning hole, and said second mounting block has a second guide and a second positioning hole, and said aligning means comprises:

a) a vertical fixing pin for passing through said first guide hole and said second guide hole; and d) a positioning pin for passing through said first positioning hole and said second positioning hole.

29. The apparatus of claim 28, wherein said first guide hole and said second guide hole are round and said first positioning hole and said second positioning hole are oval.

30. The apparatus of claim 27, wherein the number of probes in said first group G1 and the number of probes in said second group G2 are equal.

31. The apparatus of claim 27, wherein said mounting portion is attached to said first mounting block by epoxy and said mounting portion is attached to said second mounting block by epoxy.

32. The apparatus of claim 27, wherein said first mounting block has a first central opening and said second mounting block has a second central opening and said first removable portion forms a first periphery of said first central opening and said second removable portion forms a second periphery of said second central opening.

33. The apparatus of claim 32, wherein first central opening is larger than said second central opening.

34. The apparatus of claim 27, wherein said first removable portion comprises a first removable section terminating at said first through-hole and a second removable section commencing at said first through-hole.

35. The apparatus of claim 27, further comprising a spacer block between said first mounting block and said second mounting block.

36. The apparatus of claim 35, further comprising epoxy on said first mounting block under said spacer block.

* * * * *